United States Patent
Sheu et al.

(10) Patent No.: US 6,703,187 B2
(45) Date of Patent: Mar. 9, 2004

(54) METHOD OF FORMING A SELF-ALIGNED TWIN WELL STRUCTURE WITH A SINGLE MASK

(75) Inventors: Yi-Ming Sheu, Hsinchu (TW); Fu-Liang Yang, Hsin-Chu (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 98 days.

(21) Appl. No.: 10/043,861

(22) Filed: Jan. 9, 2002

(65) Prior Publication Data

US 2003/0129540 A1 Jul. 10, 2003

(51) Int. Cl.[7] .......................... G03F 7/26; H01L 21/425
(52) U.S. Cl. .................. 430/314; 430/311; 430/313; 430/322; 430/323; 430/324; 438/451; 438/510; 438/514; 438/526; 438/527
(58) Field of Search ................................. 430/311, 313, 430/314, 322, 323, 324; 438/451, 510, 514, 526, 527

(56) References Cited

U.S. PATENT DOCUMENTS

| 4,558,508 A | * | 12/1985 | Kinney et al. ............ 438/401 |
| 4,578,859 A | * | 4/1986 | Hause et al. ............. 438/526 |
| 5,026,666 A | * | 6/1991 | Hills et al. .............. 438/301 |
| 5,670,395 A | * | 9/1997 | Pan ....................... 438/451 |
| 5,956,583 A | * | 9/1999 | Fuller et al. ............ 438/218 |
| 6,207,538 B1 | * | 3/2001 | Pan et al. ............... 438/510 |

* cited by examiner

Primary Examiner—Mark F. Huff
Assistant Examiner—Nicole Barreca
(74) Attorney, Agent, or Firm—Tung & Associates

(57) ABSTRACT

An improved method for forming a self-aligned twin well structure for use in a CMOS semiconductor device including providing a substrate for forming a twin well structure therein; forming an implant masking layer over the substrate to include a process surface said masking layer patterned to expose a first portion of the process surface for implanting ions; subjecting the first portion of the process surface to a first ion implantation process to form a first doped region included in the substrate; forming an implant blocking layer including a material that is selectively etchable to the implant masking layer over the first portion of the process surface; removing the implant masking layer to expose a second portion of the process surface; and, subjecting the second portion of the process surface to a second ion implantation process to form a second doped region disposed adjacent to the first doped region.

20 Claims, 1 Drawing Sheet

METHOD OF FORMING A SELF-ALIGNED TWIN WELL STRUCTURE WITH A SINGLE MASK

FIELD OF THE INVENTION

This invention generally relates to semiconductor processing methods for forming CMOS devices and more particularly to methods for forming self-aligned twin well structures.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS) and bipolar integrated circuit technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, which can damage the circuit temporarily, or permanently, noise margin degradation, voltage shift and cross-talk.

Shallow trench isolation (STI), is a preferred electrical isolation technique especially for a semiconductor chip with high integration. STI can be made using a variety of methods including, for example, the Buried Oxide (BOX) isolation method for shallow trenches. The BOX method involves filling the trenches with a chemical vapor deposition (CVD) silicon oxide ($SiO_2$) which is then etched back or mechanically/chemically polished to yield a planar surface. The shallow trenches etched for the BOX process are anisotropically plasma etched into the substrate, for example, silicon, and are typically between 0.35 and 0.8 microns deep. STI features are typically formed around the active device to a depth between 3000 and 20000 Angstroms.

Shallow trench isolation features with trenches having submicrometer dimensions are effective in preventing latch-up and punch-through phenomena. Broadly speaking, conventional methods of producing a shallow trench isolation feature include forming a hard mask over the targeted trench layer, patterning a soft mask over the hard mask, etching the hard mask through the soft mask to form a patterned hard mask, and thereafter etching the targeted trench layer to form the shallow trench isolation feature. Subsequently, the soft mask is removed (e.g., stripped) and the shallow trench isolation feature is back-filled, with a dielectric material, for example a CVD oxide.

In CMOS type semiconductor devices including N-channel transistors and P-channel transistors, the N-channel transistors need a P-substrate and the P-channel transistors need an N-substrate. The three approaches to forming the two different substrates are referred to as P-well, N-well, and twin-well processes. Single well structures have the disadvantage that the impurity concentration in the well region is frequently excessive resulting in increased capacitance and a decrease of the device operating speed. For high speed operating devices, it is preferable to use a twin well process whereby two separate wells are formed in into the semiconductor substrate, for example, a very lightly doped silicon thereby allowing the doping profiles in each well region (doped region) to be independently tailored thus avoiding the effects of excessive doping.

In general, the twin well includes structures such as a double diffused twin well, retrograde twin well and buried implanted for lateral isolation (BILLI) retrograde twin well structures. The double diffused twin well is formed by ion-implanting P-type and N-type impurities into a semiconductor substrate respectively using separate ion implantation masks. With this well structure, the impurity concentration in depth direction of the well is difficult to control. To overcome this problem, there have been developed the retrograde twin well and BILLI retrograde twin well structures in which P-type and N-type impurities are ion-implanted several times to better control the well concentration. In the retrograde twin well and BILLI retrograde twin well, their surface impurity concentrations are reduced to prevent punch-through and the impurity concentrations of their deep portions are increased to decrease the well resistance without varying the surface concentration which affects junction capacitance and substrate bias effect, improving resistance to latch-up.

In a typical twin-well process the semiconductor wafer, including, for example, a shallow trench isolation feature, is oxidized and capped with an implant blocking metal nitride layer, for example, silicon nitride (e.g., $Si_3N_4$). The metal nitride layer is then covered with a photoresist layer which is patterned and developed to provide a mask for selectively removing a portion of the metal nitride layer over the silicon substrate to form, for example, N-well regions. An implantation step using, for example phosphorous, is then implanted as an N-well dopant into the exposed regions of the lightly doped silicon substrate to form an N-well region. Following formation of the N-well region, a thick oxide layer is grown over the N-well region to form a second implant blocking layer. The photoresist mask is then stripped and the remaining portion of the first implant blocking metal nitride layer is etched off to reveal the silicon substrate overlying a P-well region self-aligned adjacent to the N-well region. A P-well dopant, for example, boron is then implanted into the exposed P-well region to form a self-aligned twin well structure.

One problem according to the prior art method is that the formation and removal of two implant blocking masks significantly adds to the device fabrication complexity and cost.

Therefore, there is a need in the semiconductor art to develop an improved implant blocking masking process whereby the number of required implant blocking masks are reduced thereby reducing the number of processing steps in forming a twin well structure.

It is therefore an object of the invention to provide an improved implant blocking masking process whereby the number of required implant blocking masks are reduced thereby reducing the number of processing steps in forming a twin well structure, while overcoming other shortcomings of the prior art.

SUMMARY OF THE INVENTION

To achieve the foregoing and other objects, and in accordance with the purposes of the present invention, as embodied and broadly described herein, the present invention provides an improved method for forming a self-aligned twin well structure for use in a CMOS semiconductor device.

In a first embodiment according to the present invention, the method includes providing a substrate for forming a twin well structure therein; forming an implant masking layer over the substrate to include a process surface said masking layer patterned to expose a first portion of the process surface for implanting ions; subjecting the first portion of the process surface to a first ion implantation process to form a first doped region included in the substrate; forming an implant blocking layer including a material that is selectively etchable to the implant masking layer over the first portion of the process surface; removing the implant masking layer to expose a second portion of the process surface; and, subjecting the second portion of the process surface to a second ion implantation process to form a second doped region disposed adjacent to the first doped region thereby forming a doped region interface included in a twin well structure.

In related embodiments, the substrate includes a semiconductor to include one of silicon and gallium arsenide. Further, the implant masking layer includes one of silicon nitride, silicon oxynitride, and polysilicon. Further yet, the implant blocking layer includes at least one of silicon nitride, silicon oxynitride, polysilicon, and photoresist to exclude a material included in the implant masking layer.

In another embodiment, the substrate includes an isolation feature wherein the twin well structure is formed such that the isolation feature is centrally disposed over the doped region interface. Further, the isolation feature is formed by one of shallow trench isolation (STI), localized oxidation (LOCOS), and polybuffered LOCOS.

In yet another embodiment, the thickness of the implant blocking layer and implant masking layer is varied between about 150 nm and about 2000 nm.

In another embodiment, the substrate further includes at least one implant capping layer overlying the substrate to form the process surface. Further, the at least one implant capping layer is formed of a material that is selectively etchable to at least the implant masking layer. Further yet, the at least one implant capping layer thickness is varied between about 5 nm and about 50 nm.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with respect to a self-aligned twin well structure the interface between the N-well and the P-well underlying a shallow trench isolation feature, it will be appreciated that the method for forming a twin well structure according to the present invention may be formed with or without isolation structures including different isolation structures such as LOCOS or poly buffered LOCOS.

Figure 1A:
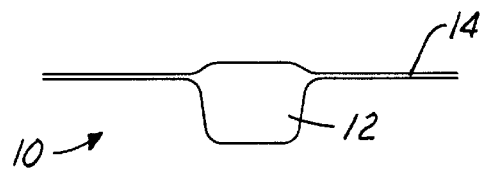
FIGS. 1A–1F are cross sectional side view representations of one embodiment of the present invention at various stages in the manufacturing process.

In the method according to the present invention, referring to FIG. 1A, a substrate 10, for example a lightly doped silicon substrate is provided. While the substrate is preferably silicon, other semiconductor substrates may be used, for example, gallium arsenide (GaAs). The substrate may be, for example, an epitaxial layer of silicon grown on a heavily doped N-type or P-type substrate. In an exemplary embodiment of the present invention, a plurality of isolation features, including for example a shallow trench isolation (STI) feature 12, is provided in the substrate 10. The STI feature 12 is formed by conventional means including, for example, forming a hard mask over the targeted trench layer, patterning a soft mask over the hard mask, etching the hard mask through the soft mask to form a patterned hard mask, and thereafter etching the targeted trench layer to form the shallow trench isolation feature. Subsequently, the soft mask is removed (e.g., stripped) and the shallow trench isolation feature is back-filled, with a dielectric material, for example a CVD oxide.

Figure 1B:
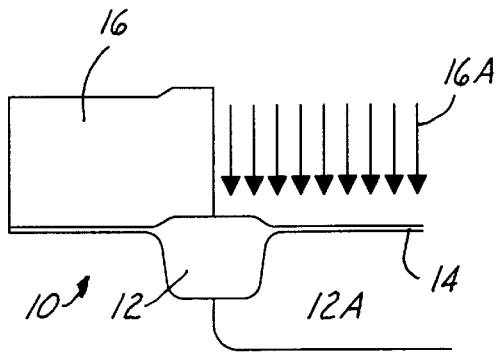

In one embodiment an optional implant capping layer 14 is formed over the substrate 10 including any features such as an STI feature 12. As known, implant capping layers are often employed to prevent contamination of the substrate and/or to reduce the amount of both axial and planar channeling that can occur during an ion implantation process. Preferably the optional implant capping layer 14 is formed of a material different than that employed for a subsequently formed overlying implant masking layer 16 as shown in FIG. 1B. For example, where the implant masking layer 16 is a nitride material, an oxide material may be advantageously used to form the optional implant capping layer 14. Thus, by forming implant masking layer 16 and the implant capping layer 14 of different materials, implant masking layer 16 can be etched selectively with respect to implant capping layer 14 to define an implant mask while allowing the implant capping layer 14 to remain overlying the substrate including doped regions such as N-well and P-well regions. Means for such selective etching of materials, for example nitride versus oxide materials, are well known in the art.

An implant masking layer 16 is deposited over the silicon substrate 10 including for example, an isolation feature such as STI feature 12 and optional implant capping layer 14. Preferably, the implant masking layer 16 is silicon nitride (e.g., $Si_3N_4$) or polysilicon. Other materials that can be selectively etched with respect to both the optional capping layer 14 (if used) and the implant blocking layer further discussed below may also be advantageously used as the implant masking layer 16 according to the present invention. For example, silicon oxynitride (SiON) may be advantageously used as the implant masking layer 16 according to the present invention. The implant masking layer 16 is preferably formed by a chemical vapor deposition (CVD) or plasma enhanced CVD (PECVD) process.

As is known, for any specific implant energy employed, implant masking layer 16 requires a minimum thickness to block implantation of ions of varying energies into substrate 10. For example, a thickness of about 150 to about 250 nm is appropriate for implant mask layer where an implant energy of about 100 keV is used to implant ions. Since various levels of energy may be used in an implanting process, the implant masking layer may typically range in thickness between about 150 nm to about 2000 nm. In embodiments where at least one optional implant capping layer 14 is employed, the at least one capping layer must be thin enough to allow implantation while protecting silicon substrate from contamination and/or ion channeling. For example, a suitable thickness for the implant capping layer 14 is between about 5 to about 20 nm.

Turning to FIG. 1B implant masking layer 16 is patterned, developed and etched by conventional photolithographic and etching processes to expose a portion of the substrate 10 including optional implant capping layer 14 forming the process surface for carrying out, for example, an ion implanting process with P-type impurities to form a P-well region 12A.

A first ion implanting process is then carried out to form a first doped region, for example P-well region 12A with implanted P-type impurities being implanted as directionally indicated by arrows e.g., 16A. It will be appreciated any ion implanting process may be used according to the present invention including, for example, forming an N-well region first. The first ion implant process may, for example, include a series of implants carried out in sequence at varying energies and doses to vary the concentration of implanted impurities in the exposed region, for example P-well region 12A.

Figure 1C:
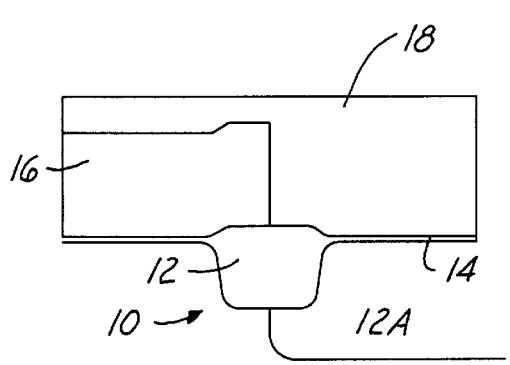

Following the first implant process, an implant blocking layer 18 is formed over the exposed portion of the substrate 10 including P-well region 12A. For example, in the deposition process the implant blocking layer 18 may optionally be formed such that a portion of implant blocking layer 18 overlies the implant masking layer 16 as shown in FIG. 1C. In the method according to the present invention, the implant blocking layer 18 is preferably formed of a different material than the implant masking layer 16 such that selective etching can occur between the implant masking layer 16 and the implant blocking layer 18. For example, if the implant masking layer 16 is silicon nitride, the implant blocking layer 18 is preferably, for example, polysilicon or photoresist. If the implant masking layer 16 is polysilicon, the implant blocking layer 18 is preferably photoresist. The implant masking layer 16, however, is preferably not formed of photoresist since the photoresist would be unable to withstand deposition temperatures during formation of the implant blocking layer 18, for example of about 150° C., required for CVD or PECVD of silicon oxynitride, silicon nitride or polysilicon. Thus, the implant masking layer 16 is preferably one of silicon nitride, silicon oxynitride, and polysilicon, while the implant blocking layer 18 is preferably formed of a material different than the implant masking layer 16 including one of silicon nitride, silicon oxynitride, polysilicon, and photoresist.

Figure 1D:
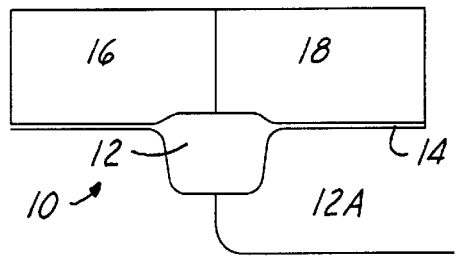

Following deposition of the implant blocking layer 18, the implant blocking layer 18 is planarized if necessary to equalize the thickness of implant masking layer 16 and implant blocking layer 18 to form a self aligned implant blocking layer 18 over the first doped region, for example, P-well 12A as shown in FIG. 1D. Planarization may take place by conventional chemical mechanical polishing (CMP) techniques, or by conventional reactive ion etching (RIE), for example, if the implant blocking layer 18 is photoresist.

Figure 1E:
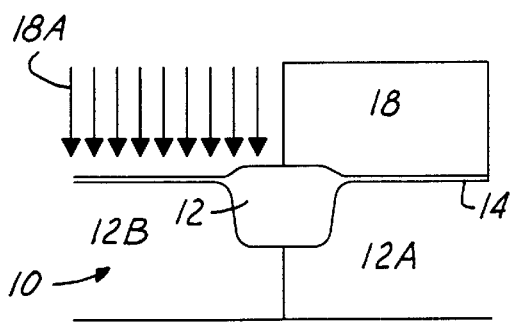

Following planarization, the implant masking layer 16 is selectively etched to remove implant masking layer 16 over selected substrate areas to expose the selected substrate areas including optional capping layer 14 for a second implanting process into silicon substrate 10. The second implanting process is carried out similar to the first implanting process to implant impurity ions as directionally indicated by arrows, e.g., 18A through the exposed portion of substrate 10, to form for example, an oppositely charged second doped region, for example, an N-well region 12B adjacent to and self-aligned with P-well region 12A as shown in FIG. 1E.

Figure 1F:
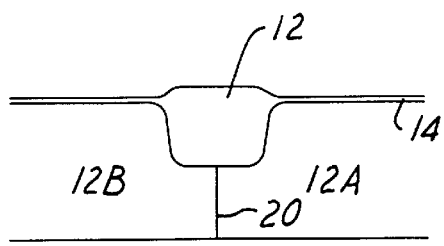

Following the second implanting process, the implant blocking layer 18 is removed according to conventional etching processes to complete the formation of the self-aligned twin well structure as shown in FIG. 1F where an interface region 20 is formed between the adjacent first doped region 12A and second doped region 12B the STI feature being centrally disposed over the interface region 20.

Thus, according to the present invention, a self aligned twin well structure is achieved by a reduced number of processing steps requiring only one photolithographic patterning step to form an implant blocking mask, e.g., 16, thereby reducing costs and improving throughput.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. An improved method for forming a self-aligned twin well structure for use in a CMOS semiconductor device comprising the steps of:

providing a semiconductor substrate comprising a process surface and an isolation feature for forming a twin well structure;

forming an implant masking layer over the semiconductor substrate said implant masking layer having a first etching selectivity patterned to expose a first portion of the process surface for implanting ions;

subjecting the first portion of the process surface to a first ion implantation process to form a first doped region underlying the first portion;

forming an implant blocking layer over the first portion comprising a second etching selectivity different from the first etching selectivity;

planarizing the implant masking layer to about the implant blocking layer level according to at least an etching process;

removing the implant masking layer to expose a second portion of the process surface; and subjecting the second portion to a second ion implantation process to form a second doped region disposed adjacent to the first doped region thereby forming a twin well structure comprising a doped region interface underlying the isolation feature.

2. The method of claim 1, wherein the substrate comprises a semiconductor selected from the group consisting of silicon and gallium arsenide.

3. The method of claim 1, wherein the implant masking layer is selected from the group consisting of silicon nitride, silicon oxynitride, and polysilicon.

4. The method of claim 3, wherein the implant blocking layer is different from the implant masking layer selected from the group consisting of silicon nitride, silicon oxynitride, polysilicon, and photoresist.

5. The method of claim 1, wherein the isolation feature is centrally disposed over the doped region interface.

6. The method of claim 1, wherein the isolation feature is formed by a process selected from the group consisting of shallow trench isolation (STI), localized oxidation (LOCOS), and polybuffered LOCOS.

7. The method of claim 1, wherein the thickness of the implant blocking layer and implant masking layer are between about 150 nm and about 2000 nm.

8. The method of claim 1, wherein the process surface comprises at least one implant capping layer overlying the substrate.

9. The method of claim 8, wherein the at least one implant capping layer is formed of a material that is selectively etchable with respect to the implant masking layer.

10. The method of claim 8, wherein the at least one implant capping layer thickness is between about 5 nm and about 50 nm.

11. A method for forming a self-aligned twin well structure in a CMOS semiconductor device comprising the steps of:

providing a semiconductor substrate comprising a capping layer for forming a twin well structure;

forming an implant masking layer selected from the group consisting of silicon nitride, silicon oxynitride, and polysilicon, over the semiconductor substrate;

photolithographically patterning the implant masking layer to expose a first portion of the process surface for implanting ions;

subjecting the first portion to a first ion implantation process to form a first doped region;

forming an implant blocking layer over the first portion comprising a material different from the implant masking layer selectively etchable with respect to the implant masking layer selected from the group consisting of silicon nitride, silicon oxynitride, polysilicon, and photoresist;

planarizing the implant blocking layer to about the implant masking layer level;

removing the implant masking layer to expose a second portion of the process surface; and subjecting the second portion to a second ion implantation process to form a second doped region disposed adjacent to the first doped region to form a doped region interface comprising a twin-well structure.

12. The method of claim 11, wherein the semiconductor substrate is selected from the group consisting of silicon and gallium arsenide.

13. The method of claim 11, wherein the silicon substrate further comprises an isolation feature wherein the twin well structure is formed such that the isolation feature is centrally disposed over the doped region interface.

14. The method of claim 13, wherein the isolation feature is formed by a process selected from the group consisting of shallow trench isolation (STI), localized oxidation (LOCOS), and polybuffered LOCOS.

15. The method of claim 11, wherein the thickness of the implant blocking layer and implant masking layer is between about 150 nm and about 2000 nm.

16. The method of claim 11, wherein the capping layer is formed of a material that is selectively etchable with respect to the implant masking layer.

17. The method of claim 11, wherein the capping layer thickness is between about 5 nm and about 50 nm.

18. The method of claim 11, wherein the implant masking layer comprises polysilicon and the implant blocking layer comprises photoresist.

19. The method of claim 11, wherein the implant masking layer is selected from the group consisting of silicon nitride and silicon oxynitride and the implant blocking layer comprises polysilicon.

20. The method of claim 11, wherein the implant masking layer is selected from the group consisting of silicon nitride and silicon oxynitride and the implant blocking layer comprises photoresist.

* * * * *